United States Patent [19]

Tihanyi

[11] 4,185,293
[45] Jan. 22, 1980

[54] OPTO-ELECTRONIC SENSING APPARATUS AND METHOD

[75] Inventor: Jenöe Tihanyi, Munich, Fed. Rep. of Germany

[73] Assignee: Siemens Aktiengesellschaft, Berlin & Munich, Fed. Rep. of Germany

[21] Appl. No.: 725,537

[22] Filed: Sep. 22, 1976

[30] Foreign Application Priority Data

Sep. 30, 1975 [DE] Fed. Rep. of Germany ....... 2543627

[51] Int. Cl.² ............................................ H01L 27/14
[52] U.S. Cl. .................................. 357/32; 250/211 J; 357/30
[58] Field of Search ......................... 357/30, 32, 24, 2; 307/311, 221 D; 250/211 J

[56] References Cited

U.S. PATENT DOCUMENTS 3,683,193  8/1972  Weimer .............................. 357/24 X

FOREIGN PATENT DOCUMENTS 1306735  2/1973  United Kingdom ...................... 357/30

OTHER PUBLICATIONS

Jespers et al., "Three-Terminal Charge-Injection Device", *IEEE J. of Solid-State Circuits*, vol. SC-11, No. 1, Feb. 1976, pp. 133-139.

*Primary Examiner*—Stanley D. Miller, Jr.
*Assistant Examiner*—James W. Davie
*Attorney, Agent, or Firm*—Hill, Van Santen, Steadman, Chiara & Simpson

[57] ABSTRACT

An opto-electronic sensor has an insulating substrate on which a plurality of x-lines of doped n (p) type conductivity semiconductor material are arranged. A light-permeable insulating layer covers the x-lines. A plurality of y-lines of electrically conductive material are then arranged over the insulating layer transversely to the x-lines. Sensor elements are formed at the crossover points of the x- and y-lines. A partial region of opposite conductivity type light sensitive material is arranged adjacent the x-line and beneath the y-line at the crossover point. This partial region forms a barrier-layer effect at a junction of the partial region with the doped semiconductor material of the x-lines.

16 Claims, 5 Drawing Figures

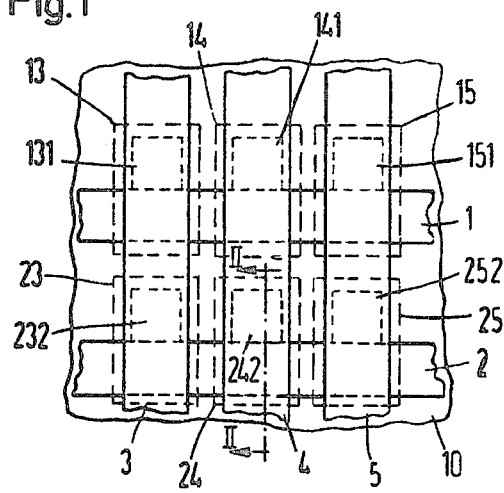
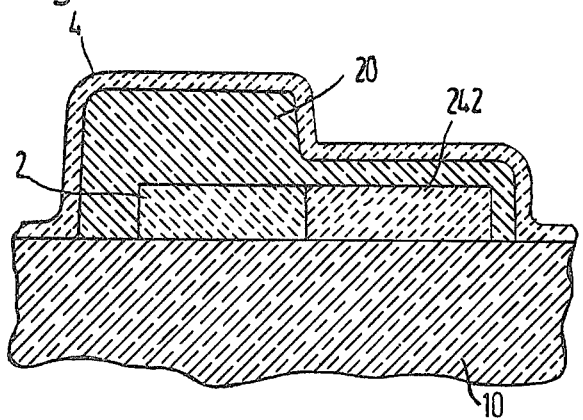

under the assumption that the sensor described in FIG. 2 is illuminated. Diagram IV shows the resulting voltage U across the load capacitance C. Between t=0 and t=t₁ switch S is closed and only the dark current flows. The voltage at the y-line is fixed at the value U₁ which approximately corresponds to the

OPTO-ELECTRONIC SENSING APPARATUS AND METHOD

BACKGROUND OF THE INVENTION

1. Field of the Invention

This invention relates to an opto-electronic sensor formed of x- and y-lines arranged on a substrate with light sensor elements formed at the crossover points.

2. Description of the Prior Art

An opto-electronic sensor of the type mentioned above is known in the prior art.

SUMMARY OF THE INVENTION

It is an object of the present invention to improve upon a sensor of the above described type.

The prior art opto-electronic sensor is improved by providing a partial region of light-sensitive material for the x-lines in each sensor element. This region has a barrier-layer effect at the junction with the doped semiconductor material of the x-line.

Particular advantages of the invention are the following: (1) reduced dark current in the sensor elements; (2) complete insulation of the sensor elements from one another; and (3) the greatest possible insensitivity with respect to oxide charge. These advantages are achieved by constructing the sensor in either n or p channel ESFI (German Trademark: Epitaxial-Silicon-Film on-Insulator) technique or in complementary ESFI technique. A further advantage of the invention is that the output voltage is proportional to the exposure (intensity of the light x time).

BRIEF DESCRIPTION OF THE DRAWINGS

FIG. 1 is a fragmentary plan view of a portion of an opto-electronic sensor in accordance with the invention;

FIG. 2 is a cross-sectional view along section line II'—II' of FIG. 1;

DESCRIPTION OF THE PREFERRED EMBODIMENTS

Figure 3:
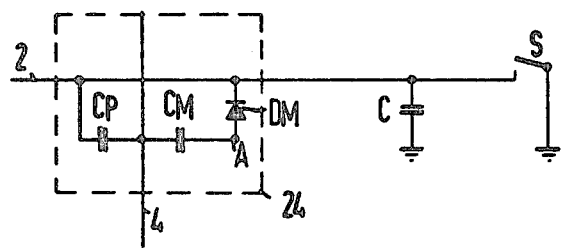
FIG. 3 is an equivalent circuit diagram of a sensor element in accordance with the invention.

In FIG. 1 adjacent and spaced strips 1 and 2 made of n (p) conducting doped semiconductor material are provided as x-lines upon an electrically insulating substrate 10. These x-lines are covered with at least one light-permeable electrically insulating layer not shown here. Adjacent strips 3 through 5 made of an electrically conductive material such as aluminum or poly-crystal silicon are applied as y-lines transversely across the x-lines. The region of an x-line which is covered by a y-line forms an actual sensor element. These actual sensor elements are framed by a broken line in FIG. 1, and are provided with reference numerals 13 through 25. Each one of these sensor elements has a barrier-layer photo diode. Such a barrier-layer photo diode is generally designed such that a substrate made of doped semiconductor material, here the x-lines, has a partial region containing a light-sensitive material which has a barrier-layer effect at the junction with respect to the doped semiconductor material. As shown in FIG. 1, these photo diodes are provided in such a way that such a partial region is present in each sensor element on at least one longitudinal side of the x-line in the form of a lateral recess. In FIG. 1, these partial regions are provided with reference numerals 131, 141, 151, 232, 242 and 252. It is preferable that the partial region does not extend over the entire cross-section of the x-line so that the x-line is not interrupted. Preferably the x-line is a good conductor. Therefore, it is doped as highly as possible.

In FIG. 2, which is representative of all remaining sensor elements, a cross-section is shown along section line II—II through the sensor element 24. The x-line 2, made, for instance, of n (p) doped silicon, is applied onto the electrically insulating substrate, for instance sapphire or spinel. It is followed by the partial region 242. The x-line and partial region 242 are jointly covered with a light-permeable electrically insulating layer 20. The y-line 4 is placed above this arrangement. For simplicity, p (n) doped semiconductor material, such as p-doped silicon, can be used as the material for the partial region. However, it is preferable that the partial region consists of a very high resistance region, for instance $\pi(\nu)$ silicon. The $\pi(\nu)$ region refers to a region within which the semiconductor material is intrinsic or is so weakly p (n) doped that its resistance value has an order of magnitude of intrinsic material. This has the advantage that the light-sensitive portion, namely the space-charge zone between the inversion layer produced during operation at the surface facing the insulating layer and an effected n (p) layer directly at the boundary surface with respect to the substrate, is very large. Furthermore, the magnitude of this space-charge zone is independent of the voltage between the x-line and the inversion layer so that the photocurrent depends linearly on the light intensity. As shown in FIG. 2, the layer thickness of the electrically insulating layer is smaller above the partial region than above the x-line. This creates the advantage that the capacitance at the crossover of the y-line over the x-line is also decreased. When silicon is used as material for the x-line and the partial region, silicon dioxide is preferably used as the electrical insulating layer.

Figure 4:
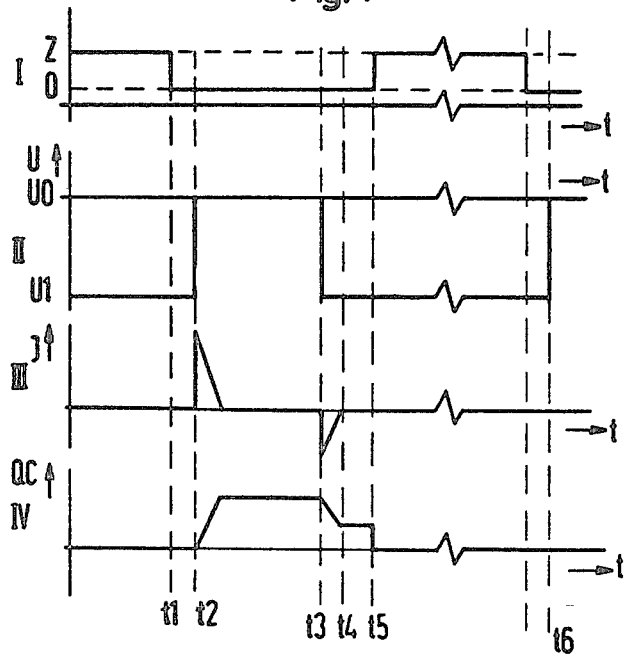
FIG. 4 illustrates operational voltages and signal shapes over time t during operation of the sensor.

The operation of the sensor in accordance with the invention may be explained in detail with the aid of FIGS. 3 and 4. For better understanding, an auxiliary circuit diagram for a sensor element is first shown in FIG. 3. The element 24 in FIG. 1 is again used to represent all remaining elements. The x-line 2 is coupled with the y-line 4 via the crossover capacitance $C_P$. This capacitance $C_P$ is formed by the insulator-layer capacitance between the y-line and the n (p) doped x-line therebelow. The capacitance $C_M$ formed by the insulator-layer capacitance between the y-line and the partial region is connected to the x-line via the diode $D_M$ which is formed by the barrier-layer junction between the partial region and the x-line. The x-line is connected with a reference-voltage source, for instance ground, via a load capacitance C. In addition, it is connected with this reference-voltage source via an on-off switch S. FIG. 4 provides a more detailed explanation of the operation. In FIG. 4, diagrams I-IV are shown with respect to time t. Diagram I represents the two positions "open" (O) and "closed" (Z) of the switch S. Diagram II indicates the voltages at the y-line with respect to the reference voltage (0 volts) produced by the reference-voltage source. Diagram III shows resulting currents J in the x-line. Diagram IV shows the charge $Q_C$ upon the load capacitance C. The n doped x-lines are used as a starting point. At time $t_1$, the switch S connected to the x-line is opened. At a later time $t_2$, the y-line, which was previously at a negative voltage U1 is switched to 0 volts. Since the capacitance C is essentially greater than the capacities $C_M$ and $C_P$, the charge positioned upon these capacitors flows off almost completely onto the capacitor C. (The charge positioned upon capacitor $C_M$ results from photocurrents as explained below from time $t_3$ to $t_6$.) A current flows for a short time in the x-line, namely at time $t_2$. At time $t_3$, the voltage upon the y-line is switched from 0 volts again to the voltage U1. Accordingly, the capacitor $C_P$ is again very quickly charged to the original value, while the re-charging of the capacitor $C_M$ is prevented by the blocked diode $D_M$. The current peak on the x-line at time $t_3$ is thus smaller than at time $t_2$, and the charge stored in the capacitor C is as large as the charge stored in the capacitor $C_M$ at time $t_1$. Directly after time $t_3$, the point A (see FIG. 4) carries the voltage U1. Due to the presence of light, however, a photo current $J_{Ph}$ now flows through the diode $D_M$, which is biased in the blocking direction. Before the beginning of the next y-line impulse at time $t_6$, the charge $Q = J_{Ph} x (t_6 - t_3)$ has collected upon the capacitor $C_M$. At $t_4$, a voltage proportional to the intruding light intensity can be measured at the capacitor C. At time $t_5$, the capacitor C is again discharged to 0 volts by a switch S.

Figure 5:
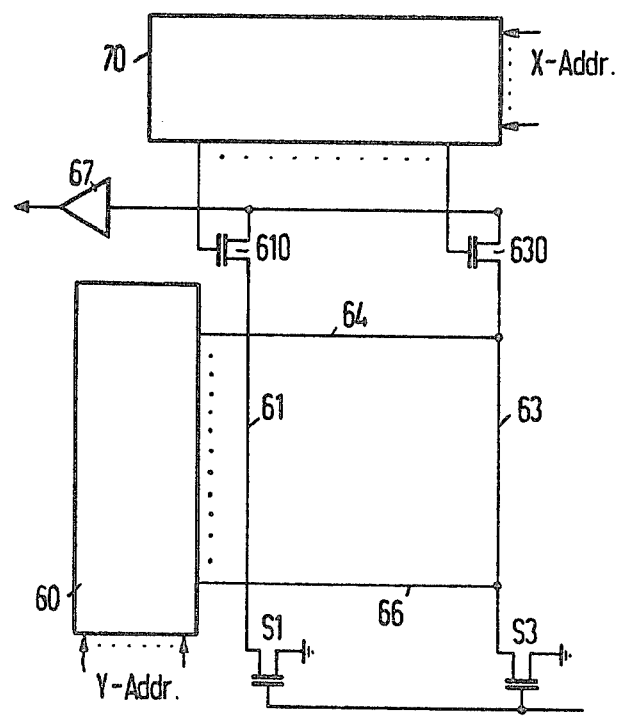
FIG. 5 schematically illustrates a system for a light-detector component element of a sensor in accordance with the invention.

FIG. 5 shows a complete light-detector component system with a sensor in accordance with the invention. Each y-line 64-66 is connected to the parallel output of a column decoder 60. Each x-line 61 through 63 is connected with ground on one side, via an electronic switch (for instance MIS-switch transistors) $S_1$–$S_3$, respectively. On the other side, each x-line is connected with an input of an impedance converter 67 via one electronic switch 610 through 630, respectively. The control electrode of each switch 610 through 630 is connected to the parallel output of a line decoder 70. The sensor elements are read out column-by-column, the read impulses entering via the column decoder. The line decoder selects a line and guides the output signal towards the output through the impedance converter 67. The output signal can be processed to become a video signal, by way of a sample circuit and hold circuit (outside of or within the light-detector component system). The decoding circuit and other required circuits can be realized by using complementary ESFI ®-technique.

It can be seen from the size of the sample embodiment in accordance with FIG. 1 that sensor elements with dimensions of less than $10 \times 15 \ \mu m^2$ can be obtained essentially without difficulty. In the sample embodiment of FIGS. 1 and 2, the cross-over capacitance $C_P$ amounts to $10^{-15}$ Farads (F) with a typical silicon-dioxide thickness of 0.9 $\mu m$ and a cross-over surface of $5 \times 5 \ \mu m^2$. If there are 100 crossings in a line, the load capacitance is $C = 10^{-13}$ F. The capacitance $C_M$, with a typical silicon-dioxide layer thickness of 0.09 $\mu m$, is $10^{-14}$ F. Even if the load capacitance C has a value of $5 \times 10^{-13}$ F, instead of $10^{-13}$ F due to additional parasitic capacitances, a ratio $C/C_M$ of 5:1 will still be obtained. When the voltage on the column line amounts to 5 volts, then the maximum signal voltage is 0.1 volts. Thus, a very favorable signal range per sensor element of between 0 and 0.1 volts is obtained.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An opto-electronic sensor comprising:
   (a) an insulating transparent substrate;
   (b) an x-line comprising a doped first conductivity type semiconductor material strip and a doped second conductivity type material region on a surface of said substrate;
   (c) a light-permeable insulating layer covering said x-line;
   (d) a y-line comprising an electrically conductive material strip arranged over the insulating layer transversely to said x-line, a sensor element being formed at the cross-over; and
   (e) said doped second conductivity type semiconductor material region being contiguous said doped first conductivity type semiconductor material strip and beneath said y-line, said doped second conductivity type semiconductor material region having a light-sensitive material for producing a barrier-layer effect at a junction with said doped first conductivity type semiconductor material strip.

2. The opto-electronic sensor of claim 1 in which a plurality of spaced apart x and y lines are provided forming a plurality of sensor elements.

3. The opto-electronic sensor in accordance with claim 1 characterized in that the electrically insulating layer has a thinner layer thickness above said doped second conductivity type semiconductor material region than at other locations.

4. The opto-electronic sensor in accordance with claim 1 characterized in that the semiconductor material of said doped second conductivity type semiconductor material region is $\pi$ doped.

5. The opto-electronic sensor of claim 1 in which said doped second conductivity type semiconductor material region semiconductor material is $\nu$ doped.

6. The opto-electronic sensor in accordance with claim 1 characterized in that said doped second conductivity type semiconductor material region, with the exception of the doping, comprises the same semiconductor material as the x-line.

7. The opto-electronic sensor in accordance with claim 6 characterized in that the semiconductor material of the x-line is silicon.

8. The opto-electronic sensor in accordance with claim 7 characterized in that the light-permeable electrical insulating layer consists of silicon dioxide.

9. The opto-electronic sensor in accordance with claim 1 characterized in that the electrical insulating substrate consists of sapphire.

10. The sensor of claim 1 in which the substrate consists of spinel.

11. The opto-electronic sensor in accordance with claim 1 characterized in that said first conductivity type semiconductor strip is an epitaxial layer of doped semiconductor material.

12. The opto-electronic sensor in accordance with claim 1 characterized in that said doped second conductivity type semiconductor material region consists of an epitaxial layer made of doped semiconductor material.

13. The opto-electronic sensor in accordance with claim 1 characterized in that the y-line consists of aluminum.

14. The opto-electronic sensor of claim 1 in which the y-line consists of polysilicon.

15. A method in an opto-electronic sensor for collecting charge carriers produced by light in a sensor element formed by crossing x and y lines with a barrier-layer effect member at the crossing, comprising the steps of:
  (a) providing a semiconductor material x-line of n conductivity type, a plurality of opposite conductivity type semiconductor material regions along one longitudinal side of the x-line and a sensor element being formed where a y-line crosses the x-line and overlies one of the opposite conductivity type semiconductor material regions, a first capacitance being formed at the x- and y-line crossing, a second capacitance being formed by the opposite conductivity type region and y-line, and a third capacitance being formed by the x-line and a reference voltage point;
  (b) connecting the x-line to a reference voltage;
  (c) connecting the y-line to a further voltage which is negative with respect to the x-line so as to charge the first and second capacitances, said second capacitance charging in relation to light intensity on said sensor element;
  (d) reading out collected charge from said sensor element by first disconnecting the x-line from the reference voltage and subsequently connecting the y-line to the reference voltage so as to transfer charge to the third capacitance; and
  (e) determining an output signal to complete the reading out by again connecting the y-line to the further voltage so as to transfer some of the charge away from the third capacitance in relation to light intensity and measuring a voltage difference on the x-line in relation to the reference voltage.

16. A method in an opto-electronic sensor for collecting charge carriers produced by light in a sensor element formed by crossing x and y lines with a barrier-layer effect member at the crossing, comprising the steps of:
  (a) providing a semiconductor material x-line of p conductivity type, a plurality of opposite conductivity type semiconductor material regions along one longitudinal side of the x-line and a sensor element being formed where a y-line crosses the x-line and overlies one of the opposite conductivity type semiconductor material regions, a first capacitance being formed at the x- and y-line crossing, a second capacitance being formed by the opposite conductivity type region and y-line, and a third capacitance being formed by the x-line and a reference voltage point;
  (b) connecting the x-line to a reference voltage;
  (c) connecting the y-line to a further voltage which is positive with respect to the x-line so as to charge the first and second capacitances, said second capacitance charging in relation to light intensity on said sensor element;
  (d) reading out collected charge from said sensor element by first disconnecting the x-line from the reference voltage and subsequently connecting the y-line to the reference voltage so as to transfer charge to the third capacitance; and
  (e) determining an output signal to complete the reading out by again connecting the y-line to the further voltage so as to transfer some of the charge away from the third capacitance in relation to light intensity and measuring a voltage difference on the x-line in relation to the reference voltage.

* * * * *